United States Patent
Xiu et al.

(10) Patent No.: US 10,079,227 B2
(45) Date of Patent: Sep. 18, 2018

(54) APPARATUS FOR RECTIFIED RC TRIGGER OF BACK-TO-BACK MOS-SCR ESD PROTECTION

(71) Applicant: Texas Instruments Incorporated, Dallas, TX (US)

(72) Inventors: Yang Xiu, Urbana, IL (US); Akram A. Salman, Plano, TX (US); Farzan Farbiz, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 91 days.

(21) Appl. No.: 15/255,521

(22) Filed: Sep. 2, 2016

(65) Prior Publication Data
US 2017/0250174 A1    Aug. 31, 2017

Related U.S. Application Data

(60) Provisional application No. 62/300,130, filed on Feb. 26, 2016.

(51) Int. Cl.
*H01L 29/66* (2006.01)
*H01L 21/8234* (2006.01)
(Continued)

(52) U.S. Cl.
CPC ...... *H01L 27/0248* (2013.01); *H01L 27/0255* (2013.01); *H01L 27/0629* (2013.01);
(Continued)

(58) Field of Classification Search
CPC ............. H01L 27/0629; H01L 27/0248; H01L 27/0255; H01L 29/7408; H01L 29/7416; H01L 29/747; H01L 29/749
See application file for complete search history.

(56) References Cited

U.S. PATENT DOCUMENTS 6,617,835 B2 *   9/2003   Nishimura ............. G05F 3/262
                                                     323/313
7,064,358 B2     6/2006   Manna et al.
(Continued)

OTHER PUBLICATIONS

Jan Polfliet and Pavel Drazdil, "Understanding the LIN PHY (physical) layer," EE Times, Jan. 28, 2008, Blog post, accessed Sep. 2, 2016, http://www.eetimes.com/document.asp?doc_id=1272421.
(Continued)

*Primary Examiner* — Alonzo Chambliss
(74) *Attorney, Agent, or Firm* — Rose Alyssa Keagy; Charles A. Brill; Frank D. Cimino

(57) ABSTRACT

An apparatus includes: a first SCR device having a first source terminal coupled to a signal terminal, a first body terminal coupled to the first source terminal, a first gate terminal coupled to the signal terminal, and a first drain terminal; a second SCR device having a second drain terminal coupled to the first drain terminal, a second gate terminal coupled to a reference voltage terminal; and a second source terminal coupled to the reference voltage terminal. The apparatus also includes: a third SCR device having a third source terminal coupled to the signal terminal, a third gate terminal coupled to the first gate terminal, and a third drain terminal; a first capacitor coupled between the third drain terminal and the second gate terminal; and a second capacitor coupled between the second gate terminal and the reference voltage terminal.

20 Claims, 6 Drawing Sheets

(51) Int. Cl.
    *H01L 27/02*     (2006.01)
    *H01L 29/747*     (2006.01)
    *H01L 29/749*     (2006.01)
    *H01L 29/74*     (2006.01)
    *H01L 27/06*     (2006.01)

(52) U.S. Cl.
    CPC ........ *H01L 29/747* (2013.01); *H01L 29/7408* (2013.01); *H01L 29/749* (2013.01); *H01L 29/7416* (2013.01)

(56) References Cited

U.S. PATENT DOCUMENTS

| | | | |
|---|---|---|---|
| 7,876,540 | B2 | 1/2011 | Deval et al. |
| 8,198,651 | B2 | 6/2012 | Langguth et al. |
| 8,354,722 | B2 | 1/2013 | Campi, Jr. et al. |
| 8,503,140 | B2 | 8/2013 | Abou-Khalil et al. |
| 8,760,831 | B2 | 6/2014 | Abou-Khalil et al. |
| 2010/0084706 | A1* | 4/2010 | Kocon ................ H01L 21/3065 257/330 |
| 2010/0230736 | A1 | 9/2010 | Zhu et al. |
| 2010/0265622 | A1 | 10/2010 | Campi, Jr. et al. |
| 2011/0063769 | A1* | 3/2011 | Kasztenny ............... H02H 3/28 361/87 |
| 2013/0201586 | A1* | 8/2013 | Torres .................... H02H 9/046 361/56 |
| 2014/0035634 | A1* | 2/2014 | Shrivastava ........... G01R 21/00 327/143 |

OTHER PUBLICATIONS

"Discretes-Explanations—Thyristors/Diodes," Semikron Product Guide, Apr. 15, 2005, pp. 26-35, accessed Sep. 2, 2016, https://www.semikron.com/dl/service-support/downloads/download/semikron-technical-explanation-discrete-thyristors-and-diodes-en-2005-04-15-rev-00.

"Teccor brand Thyristors, 25 Amp Standard SCRs," Littelfuse SK225xD Series data sheet, revised: Aug. 20, 2015, accessed Sep. 2, 2016, http://www.littelfuse.com/~/media/electronics/datasheets/switching_thyristors/littelfuse_thyristor_sk225xd_datasheet.pdf.pdf.

Ali Alaeldine, Richard Perdriau, Mohamed Ramdani, Jean-Luc Levant, "A Direct Power Injection Model for Immunity Prediction in Integrated Circuits," IEEE Transactions on Electromagnetic Compatibility, Institute of Electrical and Electronics Engineers, 2008, 50 pp. 52-62., accessed Sep. 2, 2016, https://hal.archives-ouvertes.fr/hal-00316535/document.

* cited by examiner

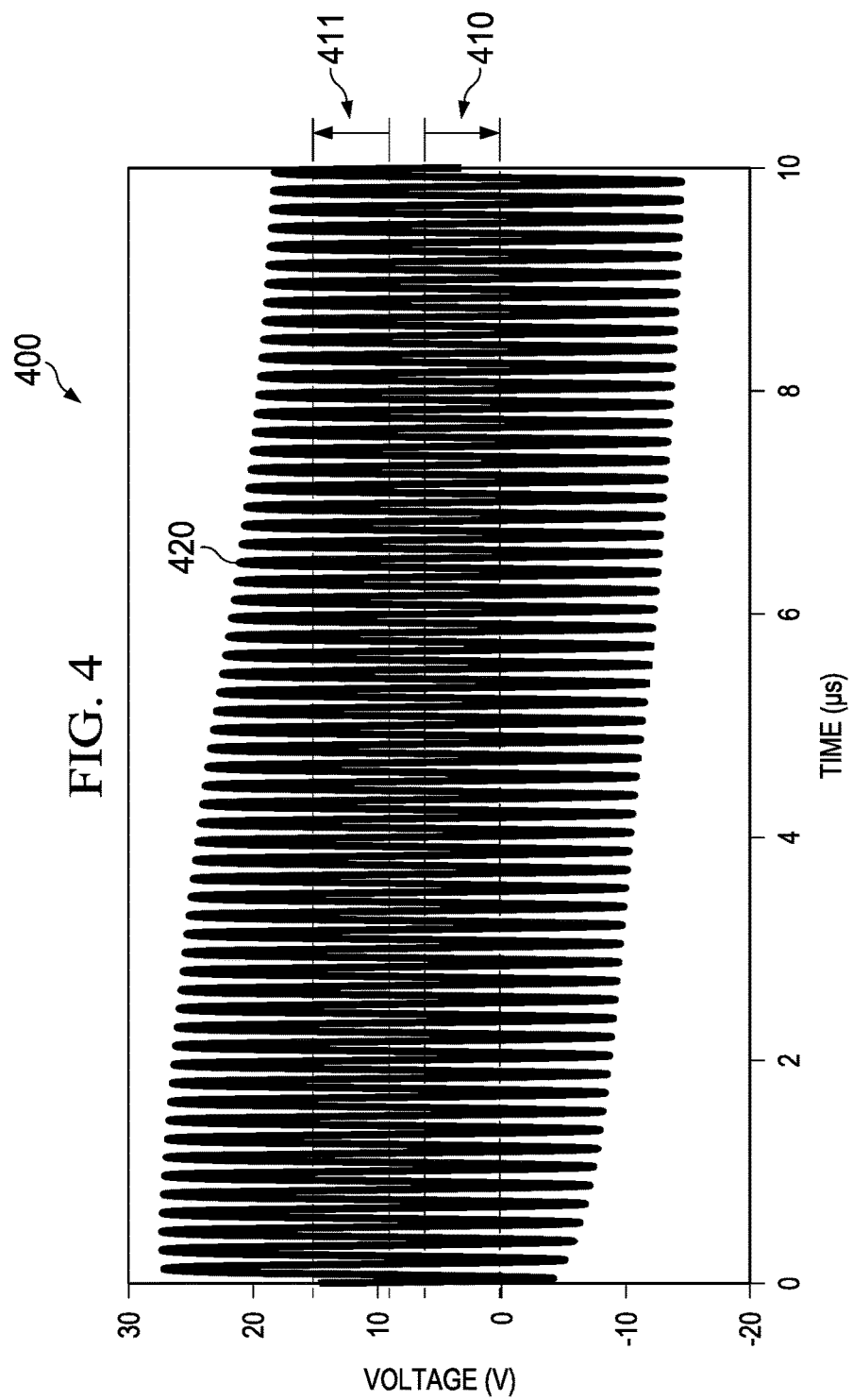

APPARATUS FOR RECTIFIED RC TRIGGER OF BACK-TO-BACK MOS-SCR ESD PROTECTION

CROSS-REFERENCE TO RELATED APPLICATIONS

This application claims the benefit of priority under 35 U.S.C. § 119(e) to co-owned U.S. Provisional Patent Application Ser. No. 62/300,130, filed Feb. 26, 2016, entitled "RECTIFIED RC TRIGGER OF BACK-TO-BACK MOSSCR ESD PROTECTION FOR LBC TECHNOLOGIES," naming Yang Xiu et. al. as inventors, which application is hereby incorporated by reference in its entirety herein.

TECHNICAL FIELD

This application relates in general to semiconductor structures for electrostatic discharge (ESD) protection and more particularly, to ESD protection with bi-directional back-to-back stacked MOS-SCRs with noise immunity.

BACKGROUND

Electrostatic discharge is a concern in the design, manufacture and handling of integrated circuits (ICs). Electrostatic discharge events occur when a charged element moves into proximity of or directly contacts the terminals of an IC. Static discharge events can have potentials of many thousands of volts. ESD events can occur when the integrated circuit is not powered, during assembly and test, as well as when the integrated circuit is in use. Static can accumulate on tools, probes, machines, or even human bodies that can discharge into an integrated circuit. If no circuit protection is provided, the static discharge can cause destructive damage to the transistors or circuitry formed inside the integrated circuit. ESD protection is particularly important when the integrated circuit device is unpowered. If the ESD protection circuitry is still active when the device is powered, the ESD circuit design needs to be arranged to avoid inadvertently triggering during normal device operation.

The local interconnect network (LIN) standard refers to a serial network formed by an industry group, the LIN consortium, in the 1990s. LIN was designed as an inexpensive alternative interface to a prior approach, the controller area network (CAN) bus used in automobile connections. A LIN interface allows inexpensive components to network within an automobile. LIN uses a low cost single wire, non-shielded network that connects all the LIN components on a sub-net. The core of the LIN hardware is a single-wire transceiver that uses two complementary logic levels with a maximum data rate of twenty kilobits per second (kbps). The dominant value, Logic 0, is considered a voltage level that is 40% or less of the power supply level. The opposite value, Logic 1, is a recessive value and is considered a voltage of 60% of the power supply voltage of higher. The LIN bus is pulled high by resistors and can be driven low. The power supply is commonly 15V but may be in a range of 7V to 18V. The bus master typically has a 1K ohm pull-up resistor coupled through a diode to the battery supply voltage. Slaves typically have a 30K ohm pull-up resistor coupled through a diode to the battery voltage. LIN transceivers on the shared LIN bus operate in a wired-AND configuration where any permitted transceiver may pull the bus toward ground during operation, to indicate a Logic 0. All transceivers must be inactive to allow the pull-up resistors to return the bus to Logic 1. The use of the single wire, non-shielded network LIN connection may result in severe ESD, electromagnetic interference (EMI) and noise components that are input into any LIN transceiver while it is being plugged into, removed from, or operated on the LIN bus. For reverse polarity insertion protection and general robustness, the LIN interface specifies that a LIN transceiver is to withstand voltages from −24V to 60V, which is considered a high voltage range for integrated circuits.

In high voltage applications such as the circuitry for a LIN transceiver, back-to-back silicon controller rectifiers (SCRs) are commonly used to provide bidirectional ESD protection.

A common noise immunity test used for testing a LIN transceiver is the direct power injection (DPI) test. In this test, a high frequency, high power sinusoidal signal is applied to a transceiver circuit input or output terminal and the response of the transceiver is monitored. This test can trigger ESD circuitry.

SUMMARY

An example apparatus includes: a first SCR device having a first source terminal coupled to a signal terminal, a first body terminal coupled to the first source terminal, a first gate terminal coupled to the signal terminal, and a first drain terminal; and a second SCR device having a second drain terminal coupled to the first drain terminal, a second gate terminal coupled to a reference voltage terminal; and a second source terminal coupled to the reference voltage terminal. The apparatus also includes: a third SCR device having a third source terminal coupled to the signal terminal, a third gate terminal coupled to the first gate terminal; and a third drain terminal; a first capacitor coupled between the third drain terminal and the second gate terminal; and a second capacitor coupled between the second gate terminal and the reference voltage terminal.

BRIEF DESCRIPTION OF THE DRAWINGS

FIG. 4 is a graph showing a failing DPI test response of the ESD circuit of FIG. 2A.

DETAILED DESCRIPTION OF EXAMPLE EMBODIMENTS

Corresponding numerals and symbols in the different figures generally refer to corresponding parts unless otherwise indicated. The figures are not necessarily drawn to scale. The term "coupled" may include connections made with intervening elements, and additional elements and various connections may exist between any elements that are "coupled."

In an example embodiment, a simple, robust circuit provides ESD protection for an integrated circuit terminal, while providing noise immunity during normal device operation. In another example embodiment, the ESD circuit elements are on the same integrated circuit as a LIN transceiver. The ESD protection circuitry can be applied to provide ESD protection for any integrated circuit signal terminal that can be exposed to noise or test signals that might otherwise cause an inadvertent ESD trigger to occur.

Figure 1:
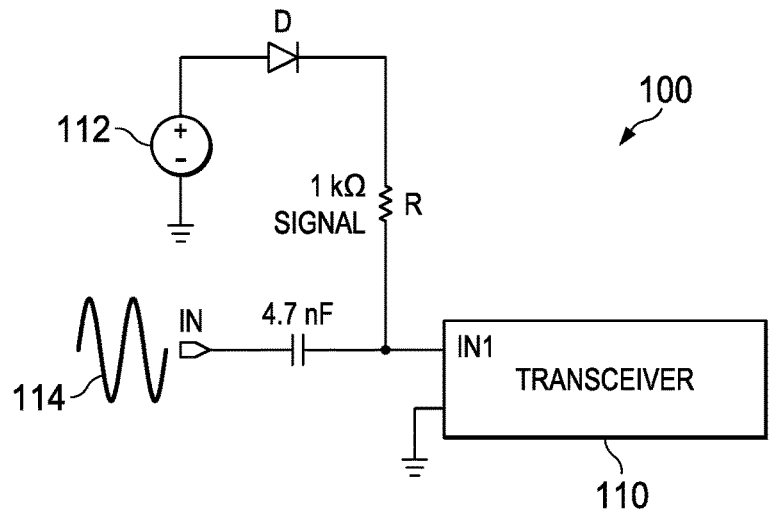
FIG. 1 is a block diagram of a test arrangement on a LIN transceiver.

FIG. 1 is a block diagram of a DPI test arrangement and a LIN transceiver. In the test arrangement 100, the input IN1 of transceiver 110 is pulled to a Logic 1 voltage level through a diode D and 1K ohm resistor R coupled to a DC voltage 112. DC voltage 112 is typically a vehicle battery voltage in a range such as 12-15V. A high power noise signal 114 is transmitted to the input pin IN through a capacitor that can be 4.7 nF. In FIG. 1 a sinusoidal signal is shown as the input noise signal.

Figure 2C:
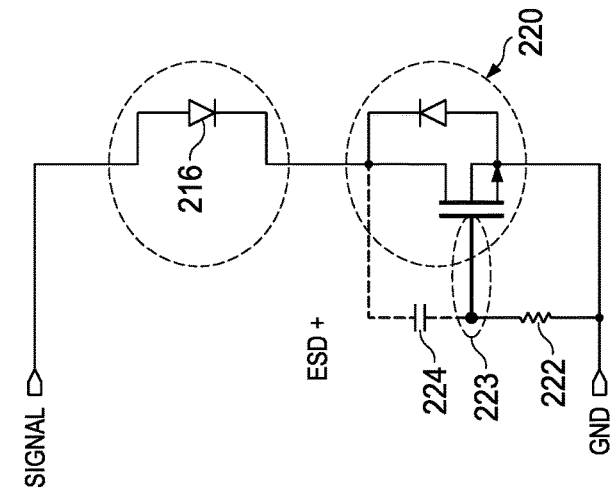
FIGS. 2A, 2B, 2C show a conventional high voltage ESD circuit utilizing back-to-back SCRs.
Figure 2B:
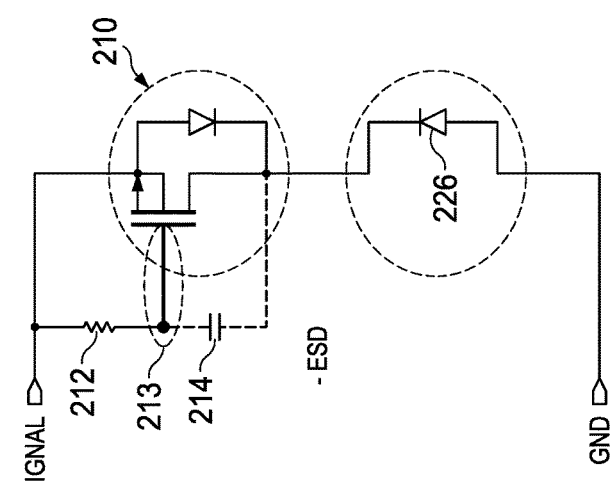
Figure 2A:
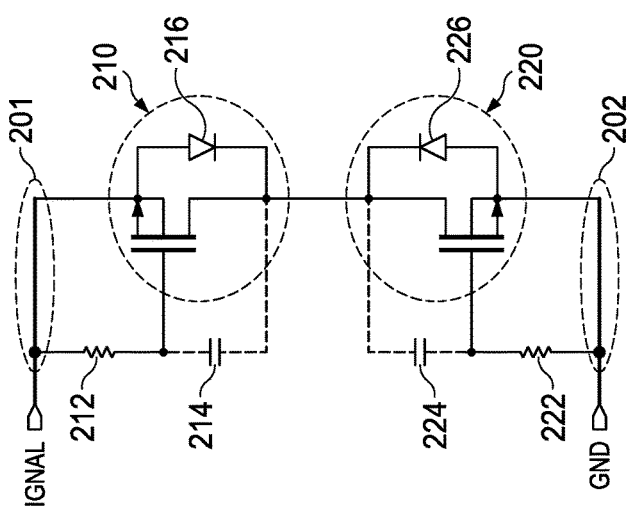

FIGS. 2A, 2B, and 2C show three circuit diagrams for a conventional high voltage ESD circuit utilizing back-to-back SCRs. FIG. 2A shows the back-to-back MOS-SCRs 210, 220 that are used to protect a signal node 201, such as an input signal node of a LIN transceiver. The ESD circuit uses an RC circuit to detect the fast rising edges in an ESD event, and the ESD event triggers one of the MOS-SCRs 210,220 depending on the polarity of the ESD pulse. The intrinsic gate capacitances 214 and 224 of the SCRs 210, 220 are shown as dashed lines to distinguish these components from explicit components. The gate resistors 212, 222 combine with the intrinsic gate capacitances 214, 224 to provide the rate-sensitive RC trigger for the MOS-SCRs 210, 220. The gate resistor values also determine the conduction voltage of the MOS-SCR. Once either MOS-SCR 210 or 220 is triggered, the back to back MOS-SCRs limit the maximum voltage of the ESD pulse between the signal node 201 and ground node 202. Because the ESD circuit of FIG. 2A limits the maximum voltage that occurs on the signal node 201, the internal circuitry (coupled to signal node 201, but not shown in FIG. 2A for clarity) is protected from damage during an ESD event.

FIG. 2B shows the equivalent circuit representation of the circuit in FIG. 2A in response to a negative polarity ESD pulse. In FIG. 2B, the body diode in the lower SCR is forward biased, leaving body diode 226 in the equivalent circuit. The ESD pulse induces a voltage on the gate node 213 of SCR 210 through intrinsic gate capacitor 214. When the voltage at the drain node exceeds the $V_{TL}$ (trigger voltage) of the MOS-SCR 210, it turns on, which limits the ESD voltage between the GND and Signal nodes. $V_{TL}$ depends on the coupled gate voltage at node 213. Gate resistor 212 discharges gate node 213 below the MOS-SCR trigger voltage $V_{TL}$, however the MOS-SCR 210 will continue to conduct until the current falls below a holding current.

FIG. 2C shows the equivalent circuit representation of the circuit of FIG. 2A when responding to a positive polarity ESD pulse. In FIG. 2C, the body diode 216 in the upper MOS-SCR is forward biased, leaving body diode 216 in the equivalent circuit. The ESD pulse induces a voltage on the gate node 223 through intrinsic gate capacitor 224. When the voltage at the drain node exceeds the $V_{TL}$ of the MOS-SCR 220, it turns on, which limits the ESD voltage between the GND and Signal nodes. $V_{TL}$ depends on the coupled gate voltage at node 223. Gate resistor 222 discharges gate node 223 below the MOS-SCR trigger voltage $V_{TL}$, however the MOS-SCR 220 will continue to conduct until the current fall below a holding current.

The MOS-SCRs 210 and 220 are sized to be able to withstand repeated ESD pulses. The intrinsic gate capacitances are proportional to the size of the MOS-SCR devices and the gate resistance values 212, 222 are selected to allow an ESD pulse to trigger the MOS-SCRs. A larger gate resistance would cause the gate to trigger at a lower voltage resulting in better ESD protection; however, a larger gate resistance value also results in lower immunity to noise. Conversely, lowering the gate resistance value causes the gate to trigger at a higher voltage, which improves noise immunity but also lessens the ESD protection. Running a full frequency DPI test on the example ESD circuit shown in FIG. 2A using 50 Kohm gate resistors reveals an insufficient noise rejection region.

Figure 3:
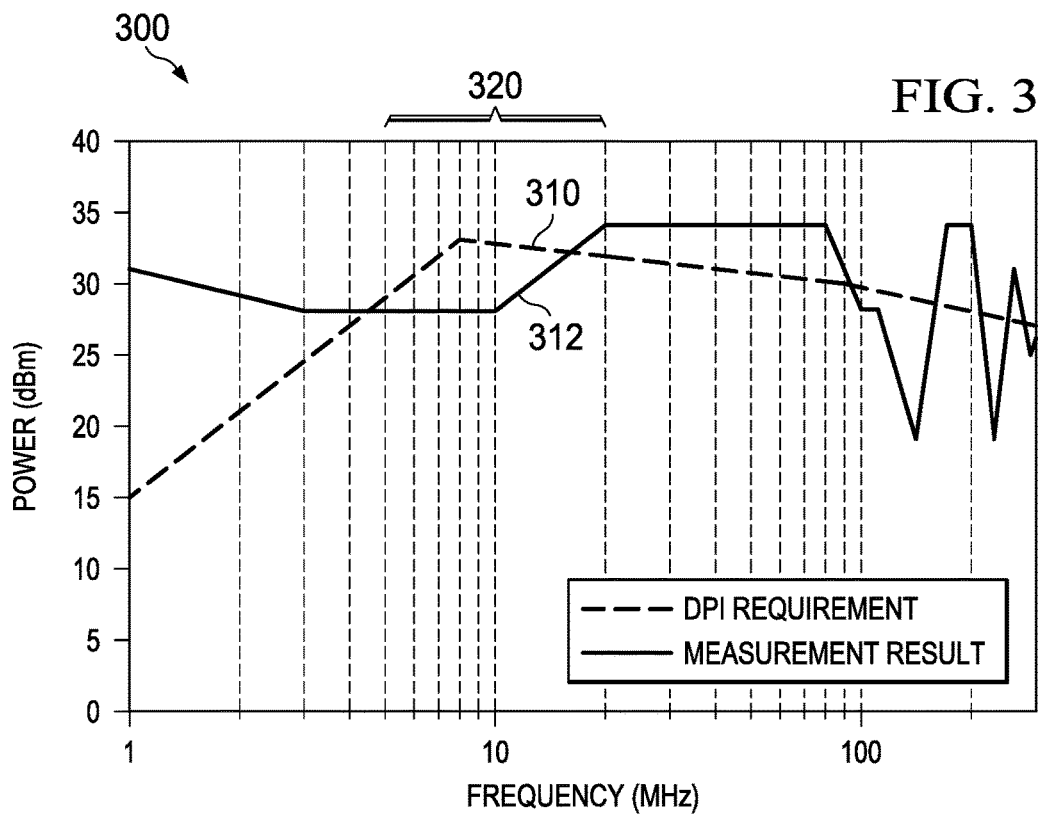
FIG. 3 is a graph showing the frequency response of an ESD circuit to a DPI test.

FIG. 3 is a graph showing the frequency response of the ESD circuit of FIG. 2A. In graph 300, the vertical or Y axis shows increasing power in dBm and the horizontal or X axis shows increasing frequency in MHz, on a log scale. The dashed line 310 shows the minimum DPI response requirement, and the solid line 312 is a measured response of an example conventional ESD circuit of FIG. 2A. In the frequency range in region 320 between 5 MHz to 15 MHz, the ESD circuit of FIG. 2A performs below the minimum DPI requirement. Therefore, FIG. 3 illustrates that a circuit including the conventional MOS-SCR ESD approach fails to meet the requirements of the LIN DPI test.

FIG. 4 is a graph showing a failing DPI test response of the ESD circuit of FIG. 2A. In graph 400, the vertical or Y axis shows increasing voltage and the horizontal or X axis shows time in micro-seconds (μs). The power supply level of this test system is 15V. Logic 1 region 411 is 60% of the power supply and greater, or 9V and more. Logic 0 region 410 is 40% of the power supply and lower, or 6V and less. Data line 420 shows the LIN transceiver input voltage in response to a 6 MHz, 40V peak-to-peak DPI noise signal injected at logic 1 level of 15V. At time 0, the DPI noise is superimposed on a logic 1 signal level. As shown in FIG. 4, the DPI noise causes the logic level to degrade to a logic 0 level voltage by time 10 μs. The logic level upset will cause incorrect operation in the transceiver, and is undesirable.

An analysis of the ESD circuit of FIG. 2A shows that the repeated high speed pulses of the DPI noise turn on MOS-SCRs 210 and 220. The DPI noise turns on the MOS-SCR 220 just as an ESD pulse would; and it will turn on continuously at the rising edges in DPI due to two factors. One is the discharge of capacitor 224 to support reverse recovery of diode 216. The charge needed for reverse recovery is dependent on the current when diode 216 is forward biased to charge capacitor 224 and provide current for MOS-SCR 220, which is then dependent on the size of MOS-SCR 220. The other factor is the coupling from capacitor 214. The strength of this coupling is dependent on the size of capacitor 214, and the gate-to-source capacitance of MOS-SCR 210, which is inherent with the size of the MOS-SCR. The MOS-SCR sizes cannot be reduced and still survive ESD discharges. Therefore, the gate of MOS-SCR 220 will be strongly coupled high in rising edges in DPI. A new approach is needed to prevent DPI type noise or other noise at a signal pin from inadvertently triggering the ESD protection circuitry and causing logic upsets in the LIN transceiver. In other applications, inadvertent triggering of ESD circuitry during operation of an integrated circuit can also cause incorrect operation of functional circuitry coupled to a signal pin.

Figure 5:
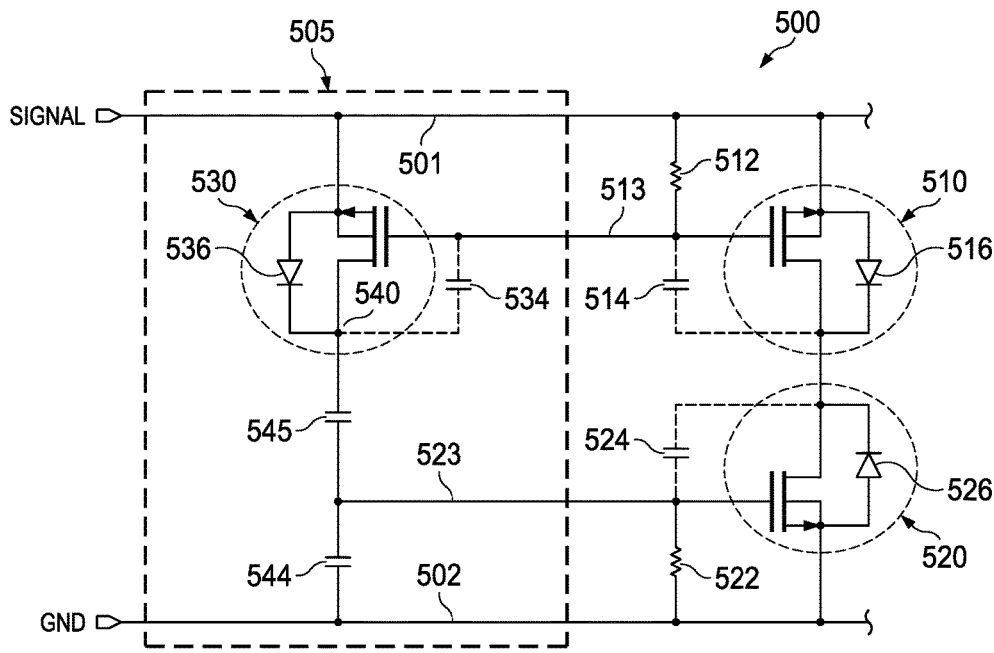
FIG. 5 shows a circuit diagram for an example embodiment of a back-to-back MOS-SCR ESD protection circuit 500.

FIG. 5 is a circuit diagram for an example embodiment of a back-to-back MOS-SCR ESD protection circuit 500. In FIG. 5, components that are similar to the components shown in FIG. 2A have similar reference labels, for clarity. For example, MOS-SCR 510 is similar to MOS-SCR 210 in FIG. 2. In circuit 500, node 501 couples the input signal terminal SIG, the source terminal of an added MOS-SCR 530, the first terminal of gate resistor 512 and the source terminal of MOS-SCR 510. The drain terminal of MOS-SCR 530 is coupled to the first terminal of capacitor 545 on node 540. Node 513 couples the gate terminal of MOS-SCR 530, the gate of MOS-SCR 510 and the second terminal of resistor 512. An intrinsic gate capacitor 534 of MOS-SCR 530 is shown coupled between the gate terminal and drain terminal. A body diode 536 of MOS-SCR 530 is shown with the anode coupled to the source terminal of MOS-SCR 530 and the cathode coupled to the drain terminal at node 540. The second terminal of capacitor 545 is coupled to the first terminal of capacitor 544, the first terminal of resistor 522 and to the gate terminal of MOS-SCR 520 on gate node 523. The second terminal of capacitor 544 is coupled to ground node 502.

Continuing to refer to FIG. 5, the drain terminal of MOS-SCR 510 is coupled to the drain terminal of MOS-SCR 520. A body diode 516 is shown with the anode coupled to the source terminal of MOS-SCR 510 and the cathode coupled to the drain terminal of MOS-SCR 510. An intrinsic gate capacitor 514 is shown with dashed lines coupled between the gate terminal and drain terminal of MOS-SCR 510. A ground potential is coupled to the source terminal of MOS-SCR 520, the second terminal of resistor 522 and the second terminal of capacitor 544 thru ground node 502. A body diode 526 is shown with the anode coupled to the source terminal of MOS-SCR 520 and the cathode coupled to the drain terminal of MOS-SCR 520. An intrinsic body capacitor 524 is shown with dashed lines coupled between the gate terminal and drain terminal of MOS-SCR 520. In alternative examples another reference voltage potential can be used in place of ground.

The example embodiment in FIG. 5 contains three components in area 505, MOS-SCR 530, capacitors 545 and 544. These components are added to the ESD circuit of FIG. 2A to form ESD circuit 500. The embodiment circuit 500 provides a robust response to the DPI test or to other noise at a circuit terminal by providing additional capacitance in the trigger circuit of MOS-SCR 520. This additional capacitance forms a capacitor that is less likely to be discharged than the intrinsic gate capacitor 524, so that MOS 520 does not turn on repeatedly in response to noise at the input. Repeatedly turning on MOS-SCR 520 in a DPI test shunts the DC component of the signal to ground. In a LIN network, the signal bus is pulled up by multiple resistors and an active component pulls the signal line to near ground. Preventing the DC component from being pulled towards ground (because the ESD circuitry is becoming active during the DPI test) will prevent the upset of the signal level by noise signals placed on the SIG terminal during the DPI test or in other situations.

In FIG. 5, MOS-SCR 530 is of the same type as MOS-SCR 510, but is sized smaller than the other devices, so that the inherent gate capacitance 534 is smaller than that of the larger MOS-SCRs 510 and 520. In response to a positive ESD pulse, the body diodes of the MOS-SCRs 530 and 510 become forward biased and the pulse energy transmits enough energy through the capacitors 524 and 545 to cause a voltage on gate resistor 522 that modulates the trigger voltage $V_{TL}$ of MOS-SCR 520. At the same time, the voltage at the common drain node exceeds the $V_{TL}$ of MOS-SCR 520. MOS-SCR 520 turns on, shunting the ESD pulse between the SIG and GND terminals. In time, the gate voltage is discharged through gate resistor 522 and the ESD circuit returns to a steady state condition.

In response to a negative ESD pulse, the body diode 526 of MOS-SCR 520 is forward biased, and the pulse energy transmits enough energy through the gate capacitor 514 to cause a voltage on gate resistor 512 that modulates the trigger voltage $V_{TL}$ of MOS-SCR 510. At the same time, the voltage at the common drain node exceeds $V_{TL}$ of MOS-SCR 510. The gate voltage turns on at least MOS-SCR 510, shunting the ESD pulse between SIG and GND terminals. In time, the gate voltage is discharged through gate resistor 512 and the ESD circuit returns to the steady state condition.

In response to a DPI noise test at the SIG terminal, the MOS-SCRs turn on and off in response to the polarity of the ESD pulses, as described hereinabove. In the embodiments, MOS-SCR 530 is sized much smaller than MOS-SCR 510. When the polarity of the DPI test signal is rapidly reversed from positive to negative (the DPI test involves a sinusoidal signal at the signal terminal SIG representing noise, as shown in FIG. 1 above), the charge loss due to reverse recovery of capacitor 545 is much less than the charge loss of capacitor 524. Capacitor 545 has a similar function as capacitor 524 for gate coupling of MOS-SCR 520, but it does not need to support as much reverse recovery charge (Qrr) to diode 536 as capacitor 524 to diode 516, since diode 536 conducts less current when it is forward biased in DPI. When forward biased, diode 516 supports current to capacitor 524 and MOS 520, while diode 536 supports current to capacitor 545 only. The voltage accumulated across capacitor 545 is thus increasing during cycles of DPI noise faster than capacitor 524, and the coupling through it to gate of MOS-SCR 520 is reduced faster. When the polarity of the DPI test is rapidly reversed from negative to positive, capacitor 545 gets less coupling from capacitor 534 than capacitor 524 from 514, due to the smaller size of capacitor 534, which again reduces coupling to gate of MOS-SCR 520. Note that resistance 522 is decreased with increased coupling capacitance.

In the embodiment of FIG. 5, the external capacitor 545 is coupled through a third MOS SCR device 530, which acts as a diode to charge the capacitor 545 for positive voltages at the input terminal SIGNAL through the forward biased body diode 536. The capacitor 545 is coupled to a different node than the common connection between the two drain terminals of MOS-SCR 510 and MOS-SCR 520. The capacitor 545 thus decouples the gate of the MOS-SCR 520 in the presence of repeated rising voltages. For the repeated positive rising voltages at the terminal SIGNAL, the gate of MOS-SCR 520 can be held low, and thus the device 520 does not turn on. The capacitor 544 in the embodiment circuit 500 of FIG. 5 is used to suppress gate coupling of MOS-SCR 520 during repeated rising voltages, as in a DPI test. By increasing the capacitors in the trigger circuitry, the resistance 512 can be reduced in value and a corresponding reduction in area can be achieved, while still maintaining the original RC time constant.

Figure 6:
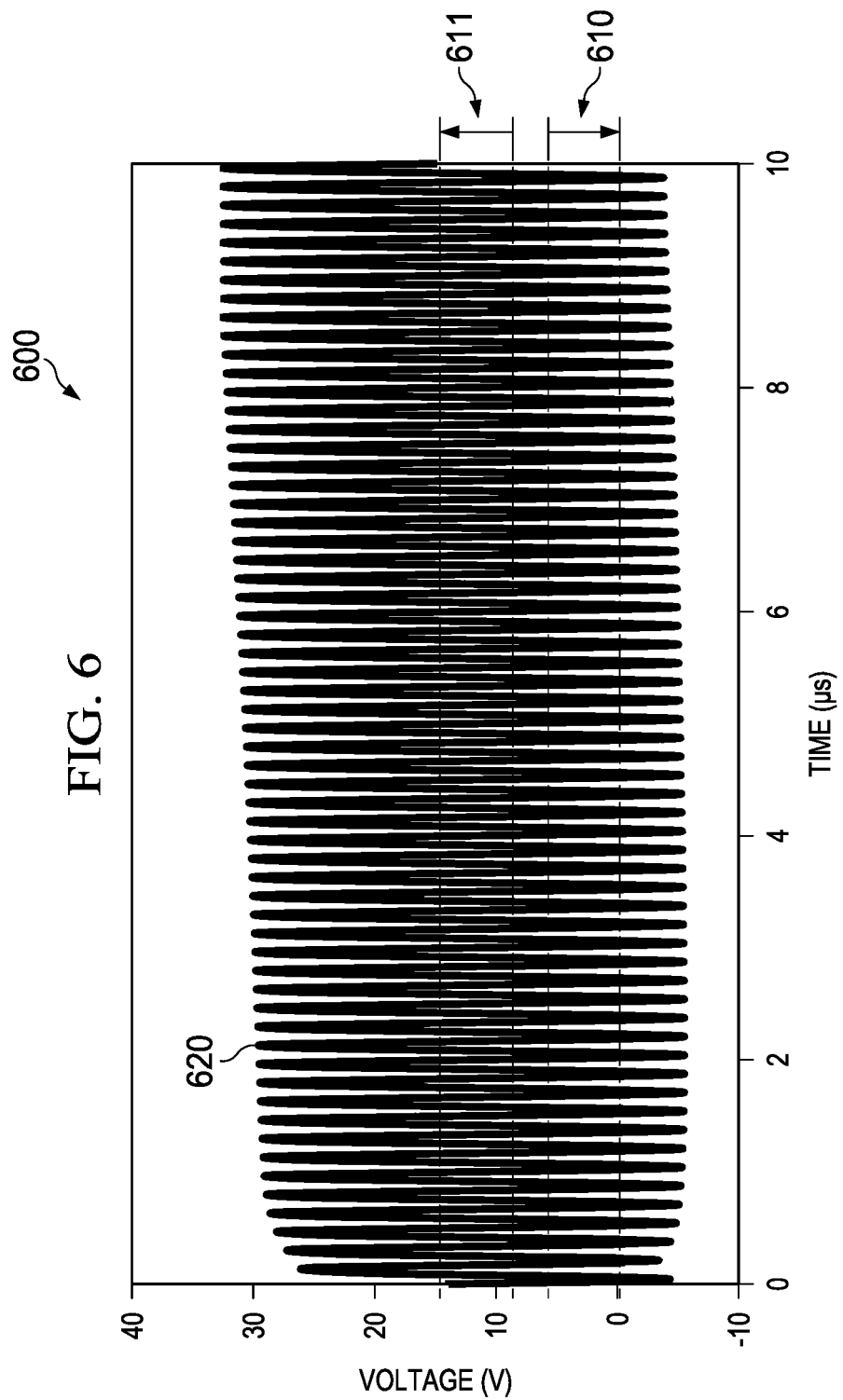
FIG. 6 is a graph showing a successful DPI test on an example embodiment circuit such as shown in FIG. 5.

FIG. 6 is a graph showing a successful DPI test on an example embodiment circuit such as shown in FIG. 5. In graph 600, the vertical or Y-axis shows increasing voltage and the horizontal or X axis shows time in micro-seconds (μs). The power supply level of this test system is 15V. Logic 1 region 611 is 60% of 16V and greater, or 9V to 15V. Logic 0 region 610 is 40% of 15V and lower, or 6V to 0V. Data line 620 shows the LIN transceiver input voltage in response to a 6 MHz, 40V peak-to-peak DPI noise signal injected on a logic 1 level signal of 15V. The data shows no degradation in the logic 1 level in the same time of 10 μs as is shown for the test results illustrated in FIG. 4, where the logic level was degraded to logic 0. Use of the embodiment circuit enables a successful DPI test on the LIN transceiver and use of the embodiment circuit will prevent noise susceptibility while providing ESD protection to integrated circuits.

In the example embodiments such as shown in FIG. 5, MOS-SCR 530 should be of the same type and smaller in size as MOS-SCR 510. The two external capacitors 545 and 544 are connected to the circuit 500 and can be fabricated using metal capacitor technology to handle the high frequencies of the DPI noise. In alternative arrangements, other device types can be used to form MOS-SCR 530. Devices that can be used include LDMOS (laterally diffused MOSFET), DEMOS (drain extended MOSFET) and p-n junction diodes can be used so long as the devices are sufficiently robust so as not to cause early failure in an ESD event. The capacitors 545, 544 can be of metal insulator metal (MIM) capacitor types or of deep trench (DT) types. Capacitors 545 and 544 can be included on board an integrated circuit including the circuit 500, as an alternative to the use of external capacitors.

Figure 7A:
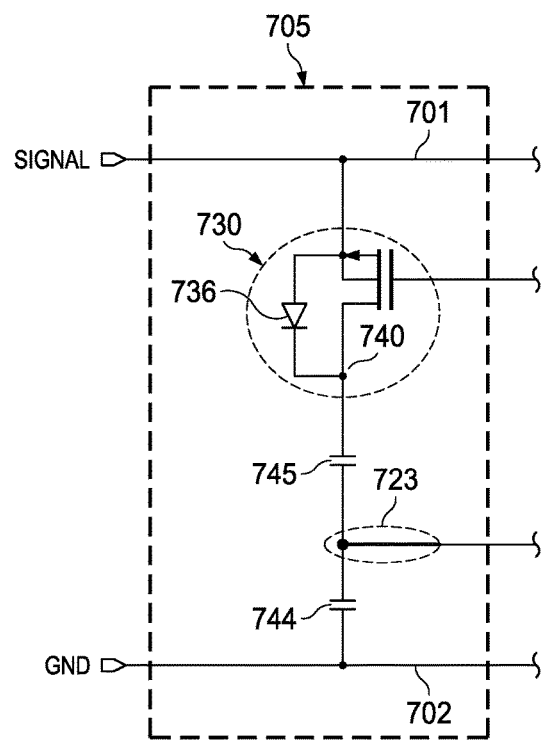
FIGS. 7A and 7B show the schematic layout and cross sectional view, respectively, of an example embodiment illustrating a compact deep trench fabrication of ESD components.
Figure 7B:
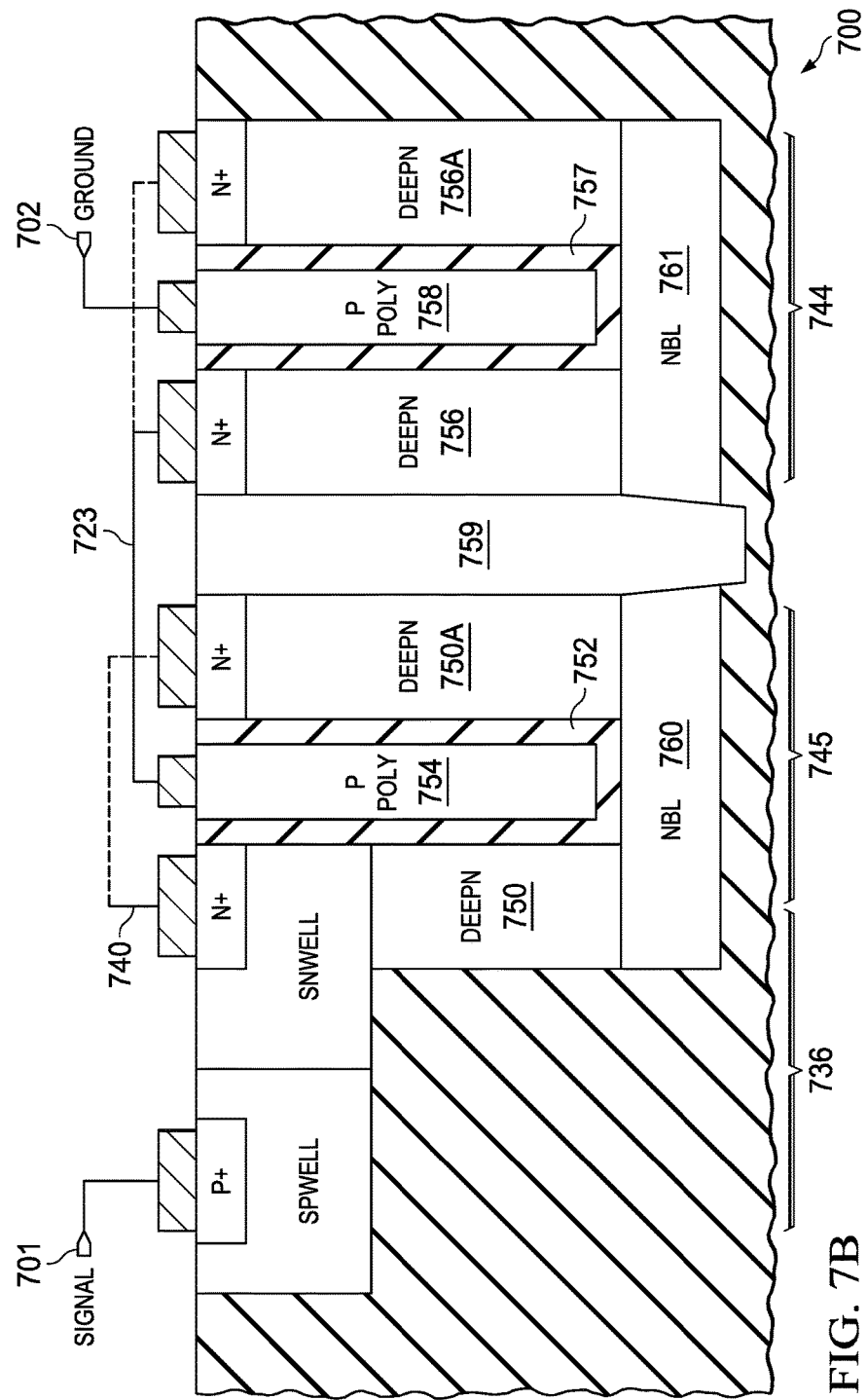

FIGS. 7A and 7B show the schematic layout and cross sectional view, respectively, of an example embodiment illustrating compact deep trench fabrication of ESD components. In FIG. 7A, the schematic of the two ESD capacitors in area 505 of FIG. 5 are shown in area 705. Similar reference labels are used for similar components in FIG. 7A as for those elements in FIG. 5, for clarity. For example, MOS-SCR 730 corresponds to MOS-SCR 530 in FIG. 5.

In FIG. 7B, a cross sectional view of a semiconductor substrate portion 700 shows the body diode 736 with signal 701 coupled to an anode terminal by a metal contact over a P+ diffusion region. The cathode terminal 740 of diode 736 is coupled to the first plate of capacitor 745 by the junction of the shallow N-well labeled SNWELL and the deep N trench region labeled DEEPN 750. The second plate of capacitor 745 is formed by p-doped poly region 754 and it is connected to a node 723 via a metal contact. Oxide layer 752 separates deep trench regions 750 and 754. The n-doped buried layer (NBL) 760 lies below the first capacitor plates 750 and 750A and connects these plates of the capacitor 745. Additional capacitance can be fabricated as needed by connecting multiple DEEPN regions as shown by region 750A. Additional p-doped poly regions can also be added (not shown) to further increase capacitance. The first plate of capacitor 744 is formed by the DEEPN region 756 and is connected to node 723. The oxide layer 757 separates the first plate from the second plate of capacitor 744, which is formed by the p-doped poly region 758. Another n-doped buried layer (NBL) 761 resides below the first capacitor plates 756 and 756A and connects these plates of the capacitor 744. Additional capacitance can be fabricated as needed by connecting multiple DEEPN regions as shown by region 756A. Additional P poly regions can also be added (not shown) to further increase capacitance. The ground node 702 is coupled to the second plate of capacitor 744 via a metal contact to the poly region 758. Capacitor 745 and capacitor 744 are electrically isolated by a deep trench oxide 759.

The regions described above can be fabricated as part of the standard integrated circuit wafer processing techniques for the LIN transceiver circuit and require no additional steps. The use of the embodiments adds negligible cost for the implementation of the ESD protection circuit. Use of the deep trench capacitors in this example embodiment allows the elimination of the external capacitors to form the embodiment circuit shown in FIG. 5, increasing integration and reducing board area.

Although the performance of the embodiments has been described using a DPI test for a LIN transceiver as an example, the embodiment circuits also reduce noise susceptibility in ESD circuitry for integrated circuits in other applications. When the embodiments are used, noise at a signal terminal will not result in a logic upset of the internal circuitry because the embodiment circuitry prevents inadvertent triggering of the ESD circuitry at the signal terminal.

In described examples, an apparatus includes: an external terminal for coupling to a signal; a first SCR device having a first source terminal coupled to the external terminal, having a first gate terminal coupled through a first gate resistor to the external terminal, and having a first drain terminal, and having a first body terminal tied to the first source terminal; and a second SCR device having a second drain terminal coupled to the first drain terminal, a second gate terminal coupled to an external reference voltage terminal through a second gate resistor, a second source terminal coupled to the external reference voltage terminal, and a second body terminal coupled to the second source terminal. The apparatus also includes a third SCR device having a third source terminal coupled to the external terminal, a third gate terminal coupled to the first gate terminal of the first SCR device, a third body terminal coupled to the third source terminal, and having a third drain terminal. The apparatus further includes a first capacitor coupled between the third drain terminal and the second gate terminal of the second SCR device; and a second capacitor coupled between the second gate terminal and the external reference voltage terminal.

In an additional example, in the apparatus, the first SCR device and the third SCR device are of the same technology type. In another example, in the apparatus, the first SCR device, the second SCR device and the third SCR device are each MOS devices. In still a further example, the third SCR device has a smaller device size than a device size of the first and the second SCR devices. In yet another example, in the apparatus, the first capacitor and the second capacitor are external to an integrated circuit that includes the first SCR device, the second SCR device, and the third SCR device.

In a further alternative example, in the apparatus, the first capacitor and the second capacitor are each metal insulator metal (MIM) capacitors. In still another example, in the apparatus, the first capacitor and the second capacitor are each formed using a deep trench structure. In yet an additional example, in the apparatus, the first capacitor and the second capacitor are each formed in a deep trench structure using doped wells as capacitor plates. In still another example, in the apparatus, the third SCR device is one selected from the group consisting essentially of an LDMOS transistor, a DMOS transistor, a DEMOS transistor, and a bipolar transistor. In still another example, in the apparatus, the external terminal is further coupled to additional circuitry within an integrated circuit. In yet a further example, in the apparatus, the first SCR device and the second SCR device form a back-to-back SCR electrostatic discharge (ESD) protection circuit for the external terminal.

In another example embodiment, an integrated circuit includes: a signal terminal for receiving an input signal; and an ESD protection circuit coupled to the signal terminal. The ESD protection circuit further includes: a first SCR device having a first source terminal coupled to the signal terminal, a first body terminal coupled to the first source terminal, a first drain terminal, and a first gate terminal coupled to the signal terminal through a gate resistor; a second SCR device having a second drain terminal coupled to the first drain terminal, a second gate terminal coupled to a voltage reference terminal through a gate resistor, a second source terminal coupled to the voltage reference terminal; and a third SCR device having a third gate terminal coupled to the first gate terminal, a third source terminal coupled to the signal terminal, a third body terminal coupled to the third source terminal, and a third drain terminal. The integrated circuit further includes a first capacitor coupled between the third drain terminal and the second gate terminal; and a second capacitor coupled between the second gate terminal and the reference voltage terminal.

In still another example, in the integrated circuit, the first capacitor and the second capacitor are external to the integrated circuit. In yet another example, in the integrated circuit, the first SCR device, the second SCR device, and the third SCR device are MOS FET devices.

In a further example, in the integrated circuit, the first SCR device and the third SCR device are the same device type and the third SCR device has a smaller device size than a device size of the first SCR device. In still another alternative example, in the integrated circuit, the first capacitor and the second capacitor are metal insulator metal (MIM) capacitors. In a further alternative example, the first capacitor and the second capacitor are deep trench capacitors. In another example, in the integrated circuit, the first capacitor and the second capacitor are deep trench devices formed on the integrated circuit.

In another alternative example, in the integrated circuit, the first capacitor and the second capacitor are deep trench devices that further include: at least one first deep N-type doped portion extending vertically into a semiconductor substrate, and forming a first plate of the first capacitor; a first deep P type portion extending vertically into the semiconductor substrate and spaced from the at least one first deep N-type doped portion by a dielectric layer, the first deep P type portion forming a second plate of the first capacitor; at least one second deep N-type doped portion extending vertically into the semiconductor substrate and forming a first plate of the second capacitor; and at least one second deep P type doped portion extending vertically into the semiconductor substrate and forming the second plate of the second capacitor, the at least one second deep P type doped portion spaced from the at least one second deep N-type doped portion by a dielectric.

In still another example, in the integrated circuit, the integrated circuit includes a shallow N-doped well region formed intersecting and electrically coupled to the at least one first deep N-type doped portion, the shallow N-doped well region forming the cathode of the body diode of the third SCR; and a shallow P-doped well region formed adjacent the shallow N-doped well region and having a junction with the shallow N-doped well region, the shallow P-doped well region forming the anode of the body diode of the third SCR device. The third SCR can then be replaced by this diode.

Modifications are possible in the described embodiments, and other embodiments are possible within the scope of the claims.

What is claimed is:

1. An apparatus, comprising:
   an external terminal for coupling to a signal;
   a first SCR device having a first source terminal coupled to the external terminal, having a first gate terminal coupled through a first gate resistor to the external terminal, and having a first drain terminal, and having a first body terminal tied to the first source terminal;
   a second SCR device having a second drain terminal coupled to the first drain terminal, a second gate terminal coupled to an external reference voltage terminal through a second gate resistor, a second source terminal coupled to the external reference voltage terminal, and a second body terminal coupled to the second source terminal;
   a third SCR device having a third source terminal coupled to the external terminal, a third gate terminal coupled to the first gate terminal of the first SCR device, a third body terminal coupled to the third source terminal, and having a third drain terminal;
   a first capacitor coupled between the third drain terminal and the second gate terminal of the second SCR device; and
   a second capacitor coupled between the second gate terminal and the external reference voltage terminal.

2. The apparatus of claim 1, in which the first SCR device and the third SCR device are of the same technology type.

3. The apparatus of claim 1, in which the first SCR device, the second SCR device and the third SCR device are each MOS devices.

4. The apparatus of claim 3, in which the third SCR device has a smaller device size than a device size of the first and the second SCR devices.

5. The apparatus of claim 1, in which the first capacitor and the second capacitor are external to an integrated circuit that includes the first SCR device, the second SCR device, and the third SCR device.

6. The apparatus of claim 1, in which the first capacitor and the second capacitor are each metal insulator metal (MIM) capacitors.

7. The apparatus of claim 1, in which the first capacitor and the second capacitor are each formed using a deep trench structure.

8. The apparatus of claim 1, in which the first capacitor and the second capacitor are each formed in a deep trench structure using doped wells as capacitor plates.

9. The apparatus of claim 1, in which the third SCR device is one selected from the group consisting essentially of an LDMOS transistor, a DMOS transistor, a DEMOS transistor, and a bipolar transistor.

10. The apparatus of claim 1, in which the external terminal is further coupled to additional circuitry within an integrated circuit.

11. The apparatus of claim 1, in which the first SCR device and the second SCR device form a back-to-back SCR electrostatic discharge (ESD) protection circuit for the external terminal.

12. An integrated circuit, comprising:
    a signal terminal for receiving an input signal;
    an ESD protection circuit coupled to the signal terminal; including:
    a first SCR device having a first source terminal coupled to the signal terminal, a first body terminal coupled to the first source terminal, a first drain terminal, and a first gate terminal coupled to the signal terminal through a gate resistor;
    a second SCR device having a second drain terminal coupled to the first drain terminal, a second gate terminal coupled to a voltage reference terminal through a gate resistor, a second source terminal coupled to the voltage reference terminal;
    a third SCR device having a third gate terminal coupled to the first gate terminal, a third source terminal coupled to the signal terminal, a third body terminal coupled to the third source terminal, and a third drain terminal;

a first capacitor coupled between the third drain terminal and the second gate terminal; and a second capacitor coupled between the second gate terminal and the reference voltage terminal.

13. The integrated circuit of claim 12, in which the first capacitor and the second capacitor are external to the integrated circuit.

14. The integrated circuit of claim 12, in which the first SCR device, the second SCR device, and the third SCR device are MOS FET devices.

15. The integrated circuit of claim 14, in which the first SCR device and the third SCR device are the same device type and the third SCR device has a smaller device size than a device size of the first SCR device.

16. The integrated circuit of claim 12, in which the first capacitor and the second capacitor are metal insulator metal (MIM) capacitors.

17. The integrated circuit of claim 12, in which the first capacitor and the second capacitor are deep trench capacitors.

18. The integrated circuit of claim 12, in which the first capacitor and the second capacitor are deep trench devices formed on the integrated circuit.

19. The integrated circuit of claim 18, in which the first capacitor and the second capacitor are deep trench devices that further include:

at least one first deep N-type doped portion extending vertically into a semiconductor substrate, and forming a first plate of the first capacitor;

a first deep P type portion extending vertically into the semiconductor substrate and spaced from the at least one first deep N-type doped portion by a dielectric layer, the first deep P type portion forming a second plate of the first capacitor;

at least one second deep N-type doped portion extending vertically into the semiconductor substrate and forming a first plate of the second capacitor; and at least one second deep P type doped portion extending vertically into the semiconductor substrate and forming the second plate of the second capacitor, the at least one second deep P type doped portion spaced from the at least one second deep N-type doped portion by a dielectric.

20. The integrated circuit of claim 19, and further including:

a shallow N-doped well region formed intersecting and electrically coupled to the at least one first deep N-type doped portion, the shallow N-doped well region forming a cathode of a diode in the third SCR device; and a shallow P-doped well region formed adjacent the shallow N-doped well region and having a junction with the shallow N-doped well region, the shallow P-doped well region forming an anode of the diode in the third SCR device.

* * * * *